United States Patent [19]

Yamada et al.

[11] 4,051,460

[45] Sept. 27, 1977

[54] APPARATUS FOR ACCESSING AN INFORMATION STORAGE DEVICE HAVING DEFECTIVE MEMORY CELLS

[75] Inventors: Shinichiro Yamada; Akira Ishida, both of Tokyo; Hisakazu Mukai, Musashino, all of Japan

[73] Assignee: Nippon Telegraph and Telephone Public Corporation, Tokyo, Japan

[21] Appl. No.: 651,740

[22] Filed: Jan. 23, 1976

[30] Foreign Application Priority Data

Feb. 1, 1975 Japan .................................. 50-13660

[51] Int. Cl.² .............................................. G06F 11/00
[52] U.S. Cl. .................................. 364/900; 235/312
[58] Field of Search ................ 340/172.5; 445/1; 235/153 AM

[56] References Cited

U.S. PATENT DOCUMENTS

| | | | |
|---|---|---|---|
| 3,350,690 | 10/1967 | Rice | 340/172.5 |
| 3,434,116 | 3/1969 | Anacker | 340/172.5 |
| 3,444,526 | 5/1969 | Fletcher et al. | 340/172.5 |
| 3,633,175 | 1/1972 | Harper | 340/172.5 |
| 3,668,644 | 6/1972 | Looschen | 340/172.5 |
| 3,699,535 | 10/1972 | Klein | 340/172.5 |
| 3,737,870 | 6/1973 | Carter et al. | 340/172.5 |
| 3,771,143 | 11/1973 | Taylor | 340/172.5 |
| 3,917,933 | 11/1975 | Scheuneman et al. | 340/172.5 X |
| 3,934,227 | 1/1976 | Worst | 340/172.5 |

*Primary Examiner* — Mark E. Nusbaum
*Attorney, Agent, or Firm* — Burgess, Ryan and Wayne

[57] ABSTRACT

An information storage device comprising an information storage unit consisting of a plurality of memory blocks each consisting of a plurality of memory cells, and means for storing therein the address information uniquely corresponding to said memory blocks including some inoperative memory blocks, whereby when the address information uniquely corresponding to a desired memory block is entered, said address information may be modified with the information stored in said means so that one of the memory blocks not including an inoperative memory cell may be selected.

2 Claims, 8 Drawing Figures

APPARATUS FOR ACCESSING AN INFORMATION STORAGE DEVICE HAVING DEFECTIVE MEMORY CELLS

BACKGROUND OF THE INVENTION

The present invention relates generally an information storage device for use in a data processing system or the like and more particularly an information storage device which may permit the use of memory cells which would be rejected in the normal production process.

In general, an information storage device must include a set of completely operative memory cells so that any of the memory cells selected may execute the correct operation. With the remarkable recent advance of the semiconductor technology, there have been mass produced information storage devices of the type in which a large number of semiconductor memory cells are integrated on a single silicon chip. However the yield of the information storage devices with every memory cell completely operative is very low. In practice, even only one of the memory cells of the information storage device is rendered inoperative, an array of memory cells including an inoperative memory cell is also rendered inoperative. Therefore the information storage device of the type described is rather not economical.

An error-checking code may be used in some cases to correct information data retrieved from an information storage device including a small number of inoperative memory cells. However, this method is effective only when only a small number of bit cells in one word are inoperative. Therefore this method cannot be employed when the information storage device includes a relatively large number of memory elements including inoperative memory cells. In order to permit the use of the memory elements each including inoperative memory cells, there has been proposed to interconnect the memory cells by by-passing the inoperative memory cells. However, the inoperative arrays of memory cells must pass through an additional production step. In case of an element consisting of a large number of semiconductor memory cells, the cost will be inevitably increased.

SUMMARY OF THE INVENTION

In view of the above, one of the objects of the present invention is to provide an information storage device which may be regarded as a device consisting of a set of completely operative memory cells even when the information storage device includes some inoperative arrays including defective semiconductor memory cells.

Another object of the present invention is to provide an information storage device which may be effectively used in practice even it includes some inoperative memory cells so that the reduction in cost of the memory cells can be attained.

A further object of the present invention is to provide an information storage device which may eliminate the step for testing in detail every memory cell of a semiconductor memory array in the production so that the inspection cost may be remarkably reduced.

A further object of the present invention is to provide an information storage device whose normal operations may be ensured even when some of the memory cells thereof should be rendered inoperative permanently without the exchange of the memory elements including such inoperative memory cells.

BRIEF DESCRIPTION OF THE DRAWING

FIG. 1b is a detailed view of a selection control information register 4 shown in FIG. 1a;

FIG. 2b is a detailed view of a tester unit 21 shown in FIG. 2a;

DESCRIPTION OF THE PREFERRED EMBODIMENTS

First Embodiment

Figure 1A:
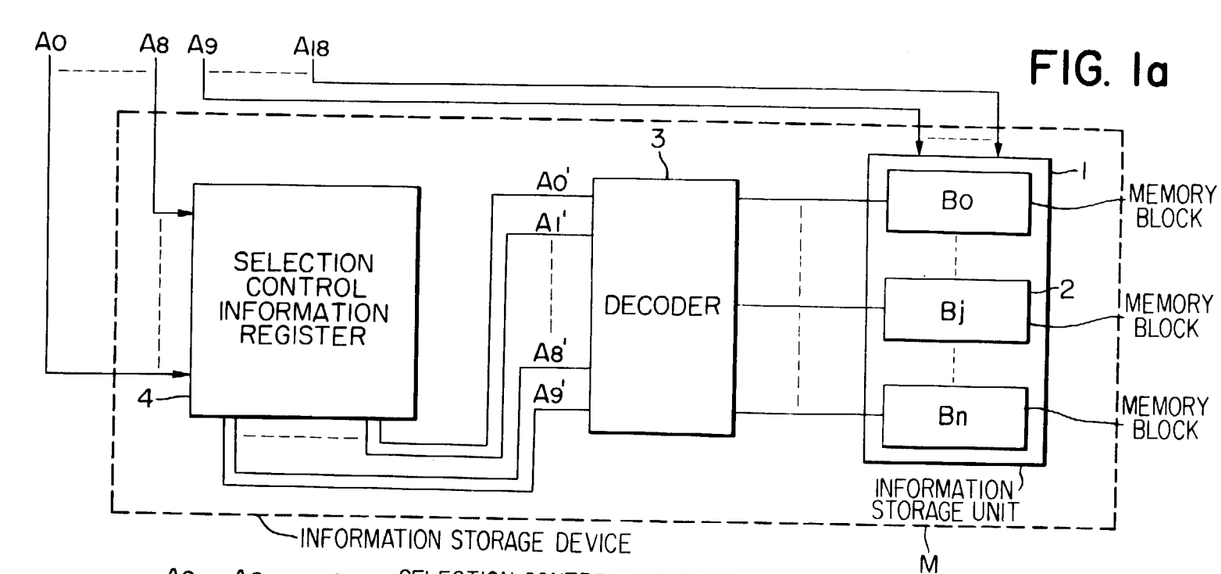
FIG. 1a is a block diagram of a first embodiment of an information storage device in accordance with the present invention.

In FIG. 1a, there is shown a first embodiment of an information storage device in accordance with the present invention which includes an information storage unit 1 consisting of a plurality of memory blocks 2 (denoted by $B_0, B_1, \ldots,$ and $B_n$) each of which is individually addressable, the number of the memory blocks 2 being so determined that a suitable number of information inputs and outputs required for constructing words of the information storage device may be obtained. In FIG. 1a, 1,024 such memory blocks are provided. A decoder 3 decodes the output or address information derived from a selection control information register 4 so that a desired memory block may be selected. The selection control information register 4 has the function of storing and registering the information whether each of the memory blocks 2 has a defective memory cell or not so that the selection control information register 4 may discriminate whether or not the memory block accessed by the address information entered by the user has a defective memory cell and then may modify the address information. In the first embodiment, the address information entered by the user consists of 9 bits $A_0, A_1, \ldots, A_8$ while the information register 4 gives the output or modified address information consisting of 10 bits $A_0', A_1', \ldots, A_9'$. That is, one additional bit is added to the address information entered by the user so that the number of modified address information may become two times as many as the number of address information. In this specification, the term "redundancy 2" is used to refer to the number of modified address information values being two times as much as that of the address information. As will be readily understood, in case of the redundancy 2, the number of the memory blocks 2 is 1024; that is two times as much as the number of 512 (9-bit) address information entered by the user. In the first embodiment, out of 1024 memory blocks 2, 512 normal memory blocks (which have no defective memory cell) are selected to write information in and read information out of the memory blocks. The selection of the 512 normal memory blocks is made in a test prior to the operation of the information storage device and the selected normal memory blocks 2 are stored and registered in the information register 4.

Figure 1B:
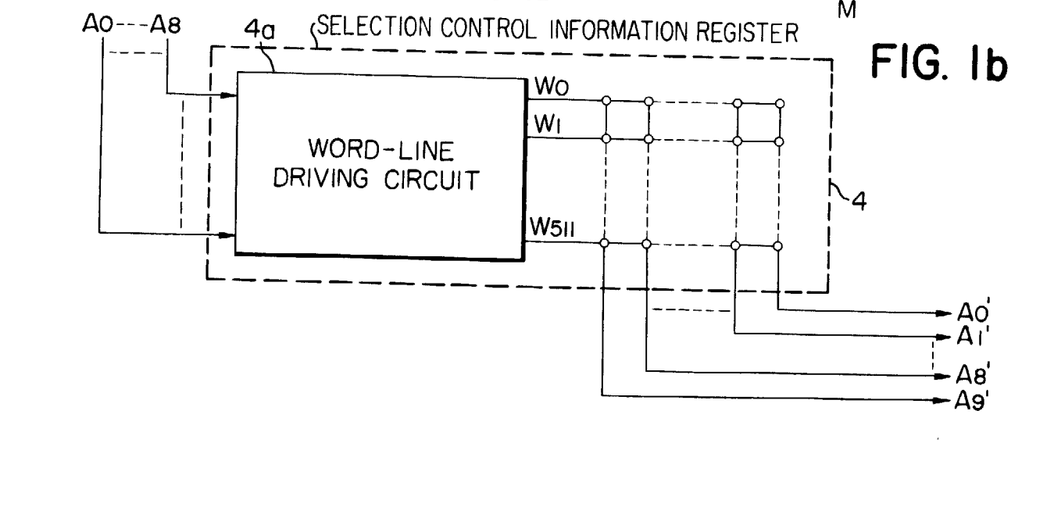

The selection control information register 4 is shown in detail in FIG. 1b. The memory block selection address information $A_0$–$A_8$ entered by the user is decoded by a wordline driving circuit 4a which has the function similar to that of the conventional decoder circuit and the function of amplifying the output information so that one of $2^9 (=512)$ word lines may be selected. Each word line is connected to 10 memory cells. When one word line is selected, information stored in the 10 memory cells connected to the selected word line is simultaneously derived as the modified address information $A_0'$–$A_9'$. The information is stored in the memory cells in a manner to be described hereinafter with reference to FIG. 2a.

Figure 2A:
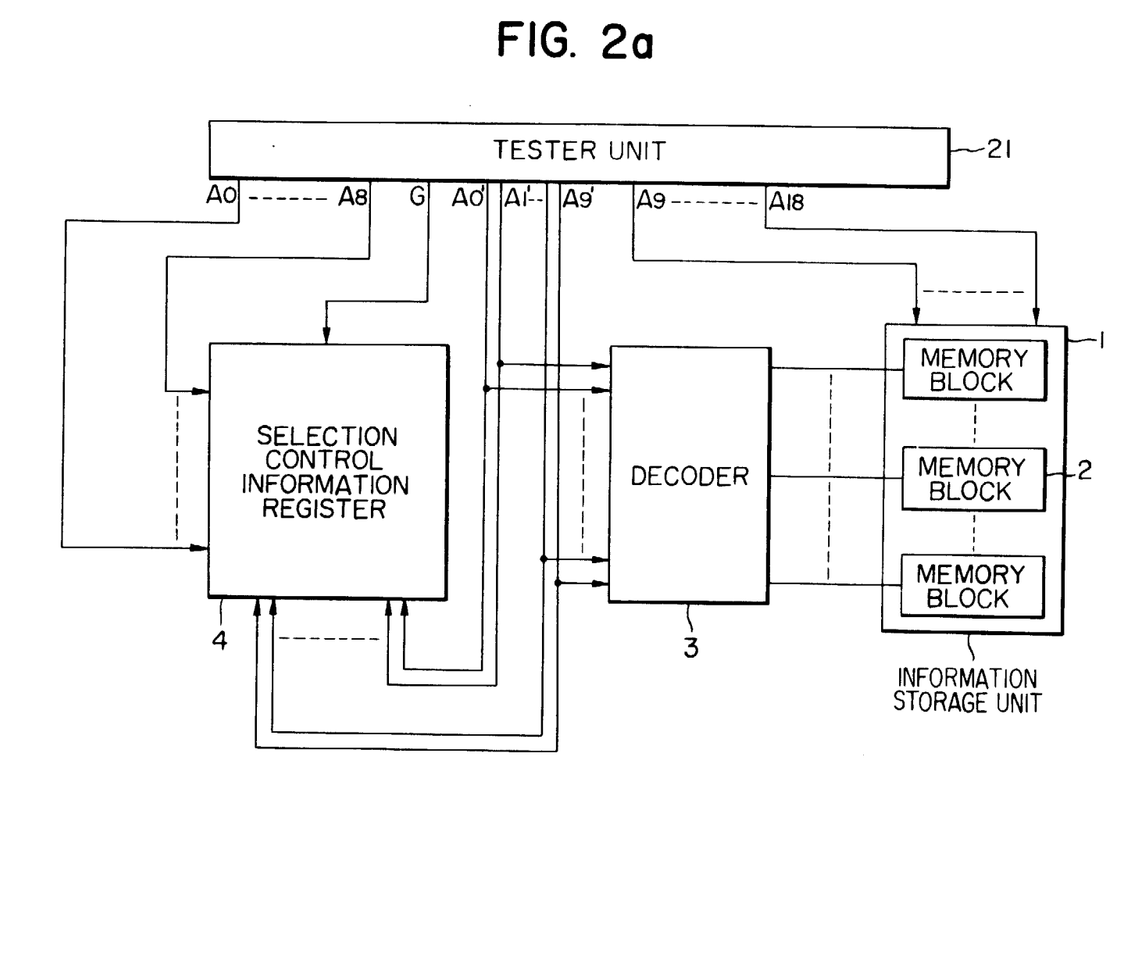
FIG. 2a is a block diagram used for the explanation of the mode of information registration into the selection control information register.

Next the method for storing the modified address information in the selection control information register 4 will be described with particular reference to FIG. 2a. A tester unit 21 has three functions. The first function is to modify the address information $A_0$–$A_8$ entered by the user into the modified address information $A_0'$–$A_9'$. The second function is to check if the memory block corresponding to the modified address information has a defective memory cell or not and to generate the signal "1" representing that the memory block has no defective memory cell or the signal "0" representing that the block has a defective memory cell. The third function is to further modify the modified address information in case of the "0" output representative of the inoperative memory block. With the tester unit 21, the address modification information is stored and registered in the selection control information register 4 in the following manner. The tester unit 21 establishes one-to-one unique correspondence between 512 address information values 9 bit of the word $A_0$–$A_8$ and 512 memory blocks corresponding 512 of the 1024 values of the 10 bit word containing the modified address information $A_0'$–$A_9'$. The modified address information is decoded by the decoder 3 so that one of the memory blocks 2 may be selected. The tester unit 21 tests whether the selected memory block 2 has a defective memory cell or not, and generates the output signal "1" or "0" at the output terminal G depending upon whether the selected memory block 2 is normal or inoperative. When the "0" output signal is derived from the terminal G, (that is, when the inoperative memory block is selected) the address information is uniquely associated with a new modified address information which must not be, of course, associated with another address information. The memory block 2 corresponding to this new modified address information is tested in a manner substantially similar to that described above. The same procedure is cycled until the output signal "1" representative of the normal memory block 2 is derived from the terminal G.

The selection control information register 4 comprises a random access memory or read-only storage capable of writing which may consist of 512 words × 10 bits, that are respectively 512 words having addresses within the register 4 corresponding to the 9-bit address information words $A_0$–$A_8$ and 10 bits per word stored in the register 4, each stored word having a value corresponding to the modified address information $A_0'$–$A_9'$. The terminal G of the tester unit 21 is connected to the selection control information register 4 so that the signal G may be used as writing and chip selection signal. That is, in response to the signal "1", the selection control information register 4 is switched to the writing mode so that the modified address $A_0'$–$A_9'$ from the tester unit 21 is stored and registered in the word location selected by the address information $A_0$–$A_8$. In response to the signal "0", the selection control information register 4 is switched to the "non-selecting mode" so that no information is entered into or derived from the selection control information register 4. The information storage and registration into the selection control information register 4 may be effected in the production step, the initial setting step and/or immediately before the operation of the information storage device. In case of the information storage device including dynamic type semiconductor memory cells, the information storage and registration may be effected in the refreshing step.

Figure 2B:
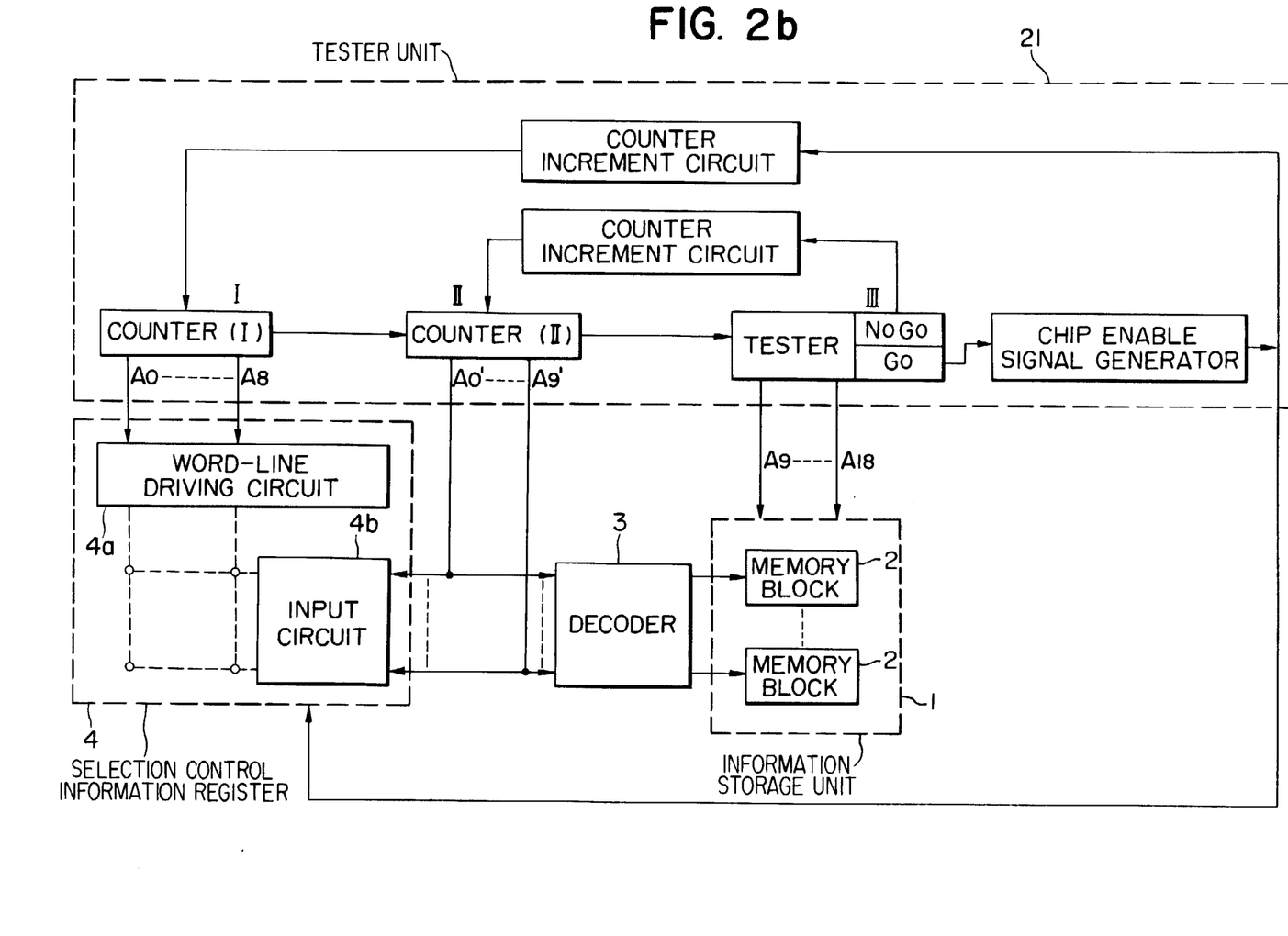

The tester unit 21 is shown in detail in FIG. 2b. In the test mode, the tester unit 21 is actuated so that the address information is sequentially read out from a first counter I and entered into a word-line driving circuit 4a in selection control information register 4 which has the same function as the word-line driving circuit shown in FIG. 1. A second counter II is actuated only after the actuation of the first counter I has been confirmed. The modified address information $A_0'$–$A_9'$ is read out of the counter II and entered into the information register 4 and the decoder 3. In response to the actuation of the second counter II, a tester III is actuated. That is, in response to the test-start signal from the second counter II, the tester III tests the memory block 2 corresponding to the modified address information $A_0'$–$A_9'$ provided by the second counter II. The tester III generates NO-GO or GO signal depending upon whether the tested memory block includes a defective memory cell or not. In response to GO signal, chip-enable signal is provided so that the selection control information register 4 is switched into the writing mode. As a result, the output information from the second counter II is written on the word line selected by the output from the first counter I. When the tester III provided NO-GO signal, no chip-enable signal is generated so that the selection control information register 4 remains in the mode incapable of writing. The content in the second counter II is increased, and in response to the output therefrom the same procedure is cycled until the chip-enable signal may be obtained.

Figure 2C:
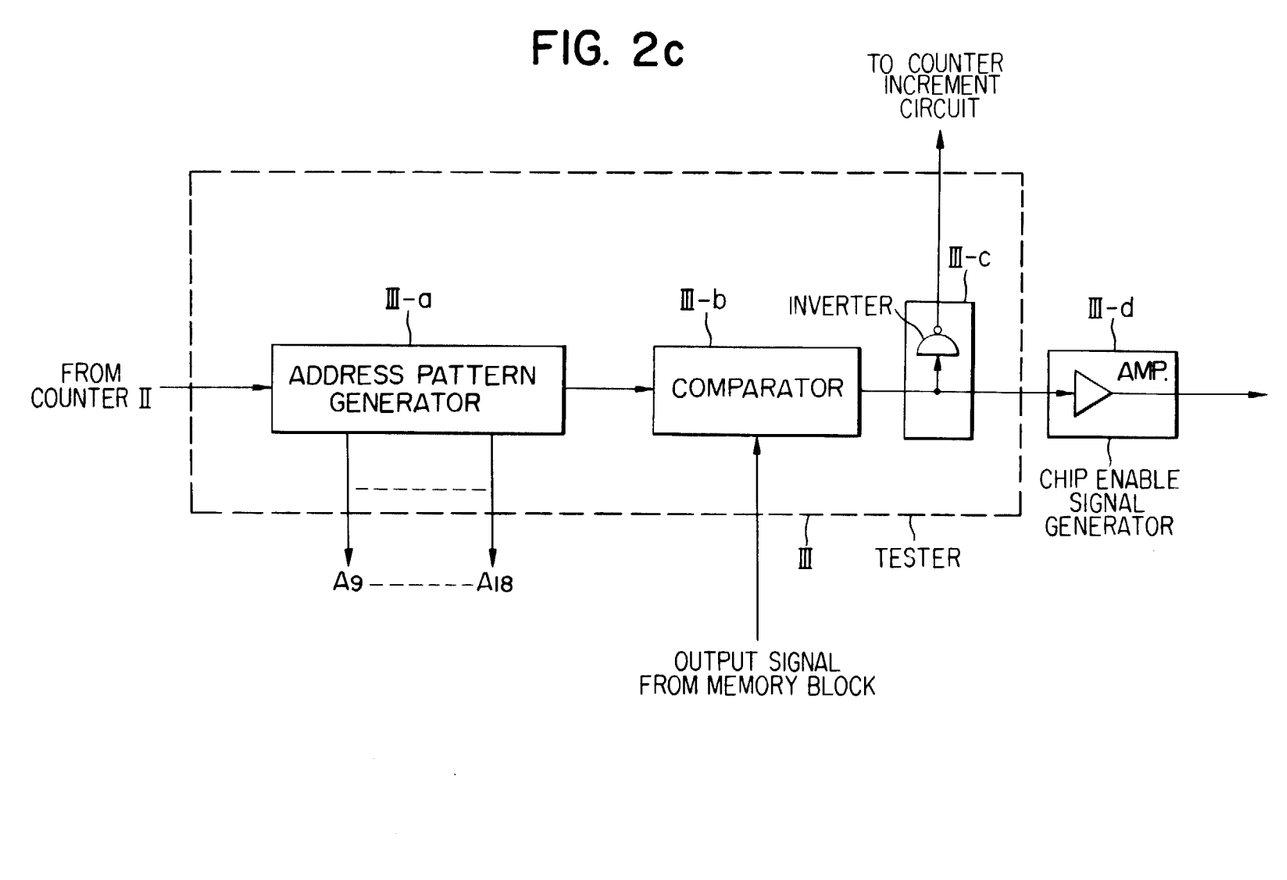
FIG. 2c is a block diagram of the tester III shown in FIG. 2b.

When the tester III shown in detail in FIG. 2C receives the signal from the counter II, an address pattern generator III-a which has the function of sequentially producing the 10-bit address information corresponding to the block address information $A_9$–$A_{18}$ in the information storage unit 1 is actuated. The address pattern generator III-a is formed with, for example, an address counter from which the contents are simultaneously read out, or the like. An address pattern generator III-a sequentially tests 1024 memory blocks in the information storage unit 1, and the output from each block is applied to a comparator III-b. The comparator III-b generates the signal "1" when the output from the memory block coincides with the output from the address pattern generator III-a, but produces the signal "0" when the outputs do not coincide with each other. The comparator III-b may be of the conventional type. The output from the comparator III-b is applied to the GO-NOGO signal generator consisting of, for instance an inverter III-c, and the output from the inverter III-c is amplified by a counter increment circuit and applied to the counter II. The output from the comparator III-b is also applied to the chip-enable signal generator III-D of the conventional type consisting of an amplifier, and the output from the chip-enable signal generator III-D is applied not only to the selection control information register 4 but also to the counter I through a counter increment circuit.

Next referring back to FIG. 1a, the mode of operation of the information storage device in accordance with the present invention will be described. It is assumed that the modified address information be stored in the word lines in the selection control information register 4 in the manner described above with reference to FIG. 2a. Of the address code $A_0, \ldots A_8, A_9, \ldots A_{18}$ entered into the information storage device M by the user, the lower digits $A_0$–$A_8$ (which is referred to as the "block address") are entered into the selection control information register 4 so that the latter provides the modified address information $A_0'$–$A_9'$ uniquely corresponding to the block address. The modified address information is decoded by the decoder 3, and the output "1" appears on one of the output lines of the decoder 3 so that the memory block 2 connected to this output line is selected. Since the modified address information has been stored and registered in order to permit the access to the operable or normal memory block in the manner described above, the selected memory block is of course operable or normal. The upper digits $A_9$–$A_{18}$ (in-block address) of the address code are entered into the memory blocks 2 so as to select the memory cells in the blocks 2. Therefore, the memory cells corresponding to the address $A_9$–$A_{18}$ are selected in the selected memory block 2 so that the information may be written or read out.

Each memory block 2 may be one silicon chip upon which are integrated a large numer of semiconductor memory cells or all memory blocks 2 may be formed upon the single silicon chip or a few memory blocks 2 may be formed upon the same single silicon chip.

The redundancy of the modified address information must be determined depending upon the number of defective memory cells in each memory block 2. The increase in one bit of the modified address information results in doubling the redundancy.

As is clear from the above description, according to the present invention, the tests or inspection for finding out the precise locations of the defective memory cells in the information storage unit 1 may be completely eliminated. Out of the memory blocks 2 in the information storage unit 1 are selected a desired number of normal or operative memory blocks 2, and there is established unique one-to-one correspondence between one block address information and one normal memory block. The modified information address uniquely corresponding to the block address information is stored and registered so that the modified address information may select the normal memory block uniquely corresponding to the block address information entered. Therefore even when some of the memory cells are rendered permanently defective or inoperative during the operation of the information storage device, any new designing thereof is not required at all. The information storage device in accordance with the present invention must include memory blocks the number of which is an even multiple of the number of information values to be stored, but the information storage device may be regarded as one including a set of completely operable memory cells. Therefore completely normal operation may be ensured without the exchange of the memory blocks including the defective or inoperative memory cells.

Second Embodiment, FIG. 3

Figure 3A:
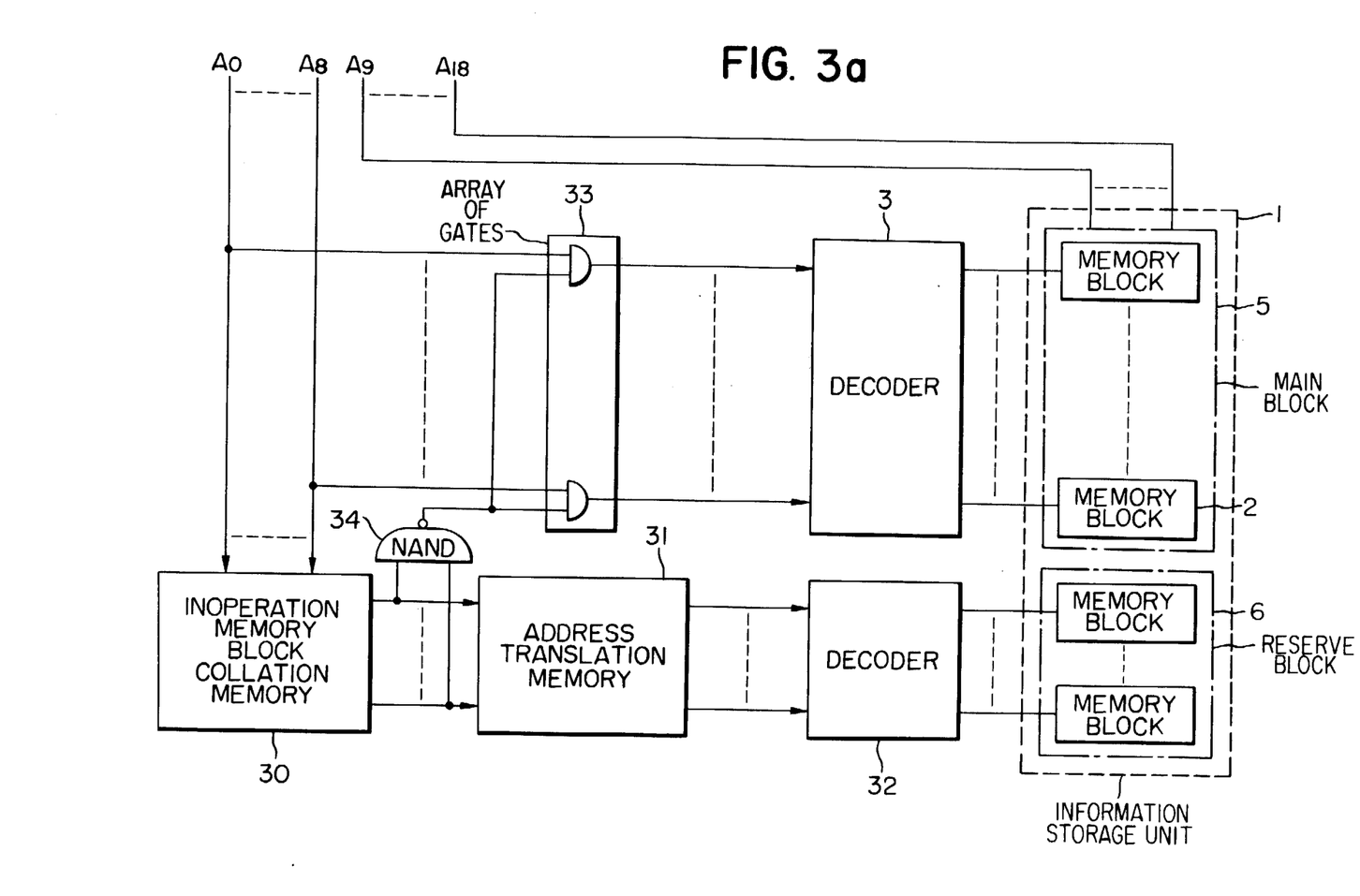
FIG. 3a is a block diagram of a second embodiment of the present invention.

The second embodiment shown in FIG. 3a is similar to the first embodiment shown in FIG. 1a in that the information storage unit 1 comprises a plurality of memory blocks 2. While in the first embodiment, there is established one-to-one correspondence between each address information $A_0$–$A_8$ and each modified address information, in the second embodiment the address modification is carried out only when the memory block in a main block corresponding to the address information entered includes a defective or inoperative memory cell so that one of the normal memory blocks that are reserved in a reserve block may be selected. In FIG. 3a, the main block is numbered by 5 while the reserve memory block, by 6. The same procedure as described with reference to FIG. 2a is followed in order to check if any of the memory blocks 2 in the main block 5 has a defective memory cell or not. The test results are stored in an inoperative memory block collation memory 30 such as an associative memory capable of retrieving all data associated with the entered key word. The collation memory 30 is connected to an address translation memory 31 in such a way that there may be established one-to-one correspondence. When the main block 5 includes an inoperative memory block 2, the address translation memory 31 is actuated so that a new address information may be selected to select a normal memory block from the reserve block 6. The second embodiment further includes the decoders 3 and 32 and an array of gates 33. The reserve block 6 consists of, for instance, $2^5 (=32)$ memory blocks.

Figures 3B, 3C:
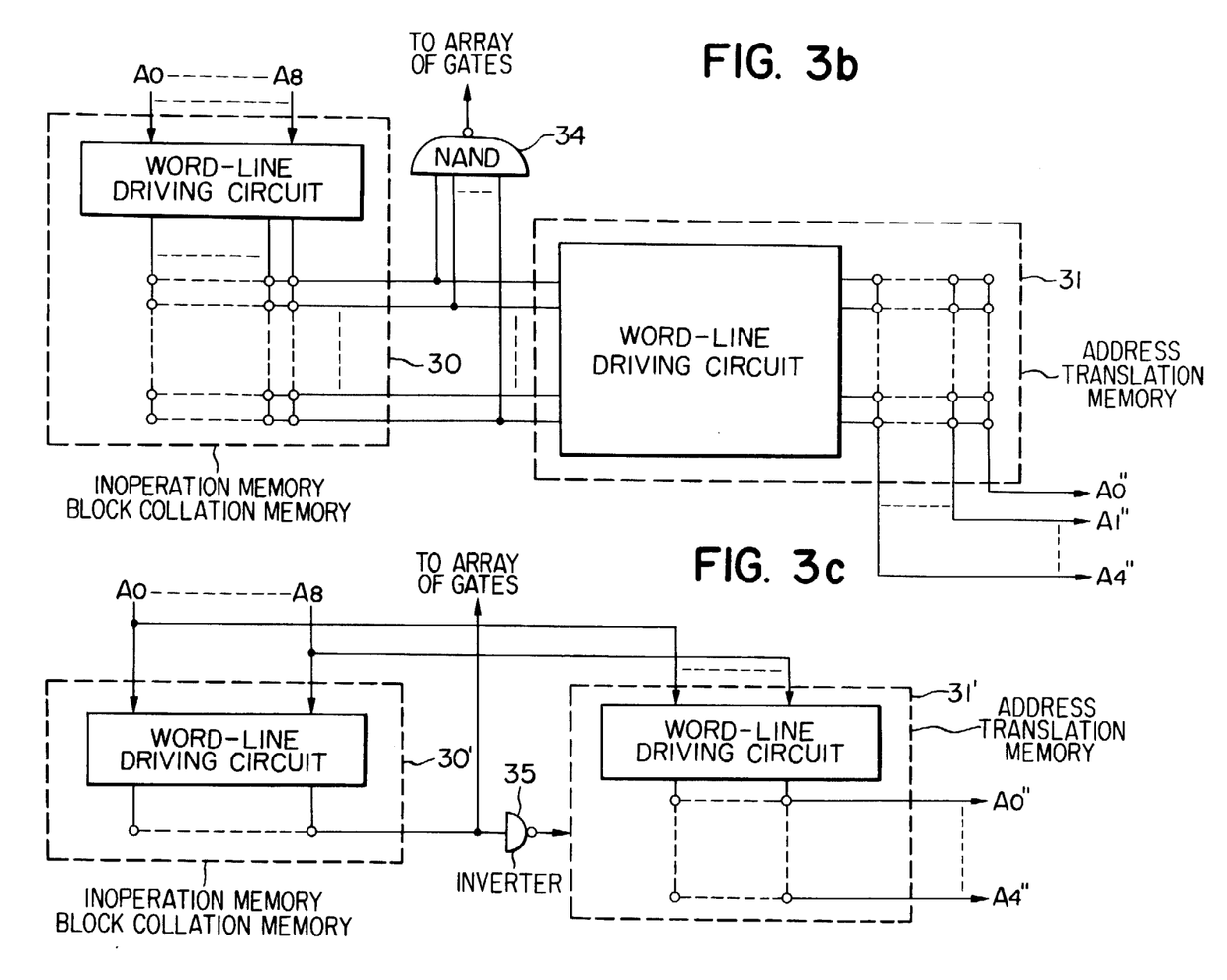
FIGS. 3b and 3c are detailed views of a collation memory 30 and an address translation memory 31 shown in FIG. 3a and modifications thereof, respectively.

The collation and address translation memories 30 and 31 are shown in detail in FIG. 3b. The block address information $A_0$–$A_8$ is entered into the collation memory 30 which compares the entered information with the stored address information. When the entered address information coincides with the stored information, the collation memory 30 provides the signal "0" representative of the memory block with no inoperative memory cell, but when the entered block address information does not coincide with the stored information, the memory 30 provides the signal "1" representative of the inoperative memory block. The output from the collation memory 30 is applied through a NAND gate 34 to the gate array 33 and directly to the address translation memory 31. The address translation memory 31 functions in a manner substantially similar to that of the selection control information register 4 of the first embodiment shown in FIG. 1a. That is, the address translation memory 31 decodes the address information $A_0'$–$A_9'$ from the collation memory 30 so as to select one of the word lines. Memory cells connected to the selected word line provide five-bit address information $A_0''$–$A_4''$ for selecting one of the memory blocks in the reserve block 6. However, when the input $A_0'$–$A_9'$ to the translation memory 31 consists of a sequence of only 0s, the translation memory 31 does not provide output.

The modified collation and address translation memories 30' and 31' are shown in detail in FIG. 3c. The address information $A_0$–$A_8$ is entered into both the collation and address translation memories 30' and 31'. The collation memory 30' compares the entered address information with the stored information and provides the signal "0" or "1" depending upon whether the memory block 2 corresponding to the entered address information has a defective memory cell or not. The output from the collation memory 30' is applied not only to the gate circuit 33 but also to the translation memory 31' through an inverter 35. When the input to the address translation memory 31' is "1" (that is, when the output from the collation memory 30' is "0"), the address translation memory 31' is actuated so that the memory cells connected to the word line selected by the address information $A_0$-$A_8$ provides 5 bit modified address information $A_0$--$A_4''$.

Referring back to FIG. 3a, the mode of operation of the second embodiment will be described. Of the address code $A_0$-$A_{18}$ entered by the user, the upper 10 digits $A_9$-$A_{18}$ are entered directly into the information storage unit 1 in order to select the memory cells in the memory block 2 while the lower nine digits $A_0$-$A_9$ are entered into the collation memory 30. As described above, the conditions of the memory blocks 2 in the main block 5 are stored in the collation memory 30, and the entered block address $A_0$-$A_8$ is compared with the information stored in the memory 30 so that when the memory block corresponding to the entered address has a defective memory cell, the collation memory 30 provides the output signal "1". In response to the signal "1", the address translation memory 31 is actuated to provide the modified address information uniquely corresponding to the entered address information. The output from the address translation memory 31 is decoded by the decoder 32 so that the corresponding memory block 2 in the reserve block 6 may be selected. In this case, the gate circuit 33 remains deactivated so that the input of the address information $A_0$-$A_8$ to the decoder 3 is interrupted. When the memory block 2 in tha main block 5 corresponding to the entered address information has no defective memory cell, the collation memory 30 provides the signal "0", in response to which the gate circuit 33 is actuated to pass the address information $A_0$-$A_8$ to the decoder 3. The address information is decoded by the decoder 3 so that the corresponding memory block 2 in the main block 5 may be selected.

As with the case of the first embodiment shown in FIG. 1a, in response to the address information input the memory block including completely operative or normal memory cells may be selected. However, according to the second embodiment, the number of the memory blocks in the reserve block 6 may be selected depending upon the number of inoperative memory blocks in the main block 5 so that the redundancy may be decreased compared with the first embodiment. As a result, the space for the information storage unit 1 may be reduced accordingly.

1. An information storage device capable of being accessed by a memory utilization means, comprising:
   an information storage unit having a given number of memory blocks, each block comprising a plurality of memory cells, one or more of said blocks containing at least one defective cell, each block having a unique address within said memory defined by a digital block address word, each cell being capable of storing a first digital word having an information portion and an address portion identifying the location of said cell within the corresponding block;
   a selection control information register having a number of memory cells equal to a desired number of said blocks to be utilized, said desired number being substantially less than said given number,
   first means for addressing with a second digital address word a selected memory cell of said register to generate a digital block address word in accordance with information in said selected cell;
   second means responsive to the value of said digital block address word to address a corresponding selected block of said storage unit;
   third means for testing each cell of said selected block and for generating a test signal having a first value indicative of the absence of defective cells therein, and a second value indicative of the presence of defective cells therein;
   fourth means responsive to the first value of said test signal for storing said digital block address word in said selection control information register, for identifying the location of said selected block in said storage unit;
   fifth means responsive to said second value of said test signal and coupled to said first means, for changing the value of the digital block address word generated by said first means to test another block of said storage unit corresponding to said changed value of said digital block address word and for actuating said third means; and
   sixth means responsive to said first value of said test signal and coupled to said first means, for changing the value of said second digital address word to address another selected memory cell of said register for generating a further digital block address word and for actuating said third means to test the corresponding newly selected block of said storage unit,
   whereby the cells of selected blocks of said storage unit are sequentially tested, and said third means for testing further including means for entering a digital block address word identifying a corresponding operative block in each memory cell of said register to establish a one-to-one correspondence between each value of said second digital address word the address of said corresponding operative block; and
   wherein said memory utilization means comprises means for selectively accessing said information storage unit by providing a desired value of said second digital address word to said register to cause the corresponding digital block address word to address a corresponding operative block of said storage unit.

2. An information storage device as set forth in claim 1 wherein said selection control information register includes an input circuit and said information storage unit includes a decoder, wherein said third means includes a tester unit comprising
   a. a first counter (I) for providing address information and for sequentially entering said information into said selection control information register,
   b. a second counter (II) responsive to the actuation of said first counter (I) to provide modified address information uniquely corresponding to the address information provided by said first counter (I) and for entering said modified address information into an input circuit of said selection control information register and into said decoder of said information storage unit,
   c. a tester (III) responsive to the actuation of said second counter (II) to test the memory block uniquely associated with said modified address information and to provide an output signal representative of the operating condition of said memory block,
d. a first counter increment circuit,
e. a chip-enable signal generating circuit for actuating said counter increment circuit in response to the output signal from said tester (III) indicative of an operative memory block to increase the contents in both said selection control information register and said first counter (I) by one unit, and
f. a second counter increment circuit for increasing the content of said second counter (II) by one unit in response to an output signal from said tester (III) indicative of an inoperative memory block.

* * * * *